Figure 1:
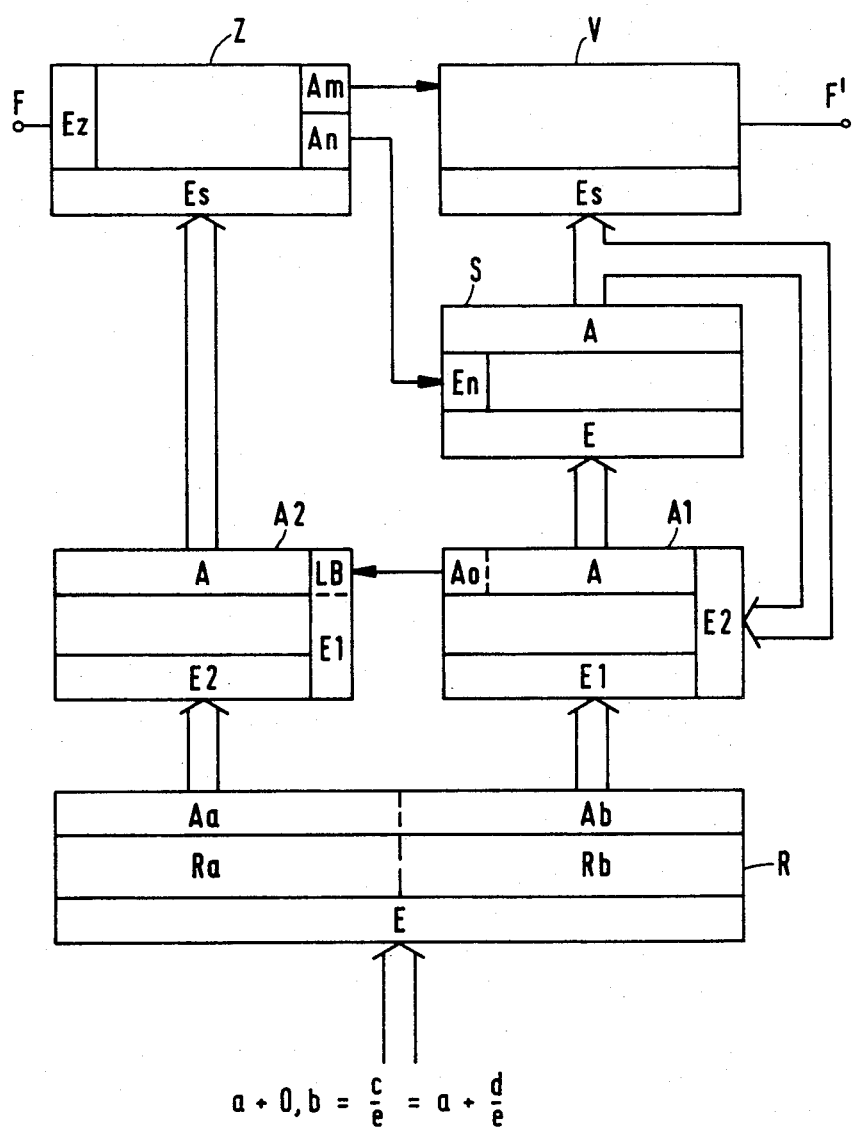

United States Patent [19]
Elmis

[11] Patent Number: 4,494,243
[45] Date of Patent: Jan. 15, 1985

[54] FREQUENCY DIVIDER PRESETTABLE TO FRACTIONAL DIVISORS

[75] Inventor: Herbert Elmis, Denzlingen, Fed. Rep. of Germany

[73] Assignee: ITT Industries, Inc., New York, N.Y.

[21] Appl. No.: 442,055

[22] Filed: Nov. 16, 1982

[30] Foreign Application Priority Data

Nov. 26, 1981 [EP] European Pat. Off. ...... 81-10-9922.5

[51] Int. Cl.³ .................. H03K 21/36; G06F 7/68
[52] U.S. Cl. .................................. 377/48; 364/703
[58] Field of Search .......................... 377/48; 364/703

[56] References Cited

U.S. PATENT DOCUMENTS

| | | | |
|---|---|---|---|
| 3,959,737 | 5/1976 | Tanis | 377/48 |
| 4,241,408 | 12/1980 | Gross | 364/703 |
| 4,295,158 | 10/1981 | Nissen et al. | 377/48 |
| 4,423,381 | 12/1983 | Stepp et al. | 377/48 |

Primary Examiner—John S. Heyman
Attorney, Agent, or Firm—Donald J. Lenkszus

[57] ABSTRACT

Division by fractions is accomplished with a counter (Z) presettable to integers and a digitally adjustable delay line (V) following this counter. The fractional parts (b) of the divisor, which are held in decimal point representation (a+0.b) in a divisor register (R), are applied to a first adder (A1) followed by a buffer memory (S), and the integral parts (a) of this divisor are applied to a second adder (A2). The output of the buffer memory (S) is coupled to the set input (Es) of the delay line (V) and to the second input (E2) of the first adder (A1). Thus, at the input of the delay line (V), the number corresponding to the fractional parts (b) is continuously increased by the fractional parts (b) until the overflow output (Ao) of the first adder (A1) provides a signal which is applied to the least significant digit (LB) of the first input (E1) of the second adder (A2). One unit is thus added to the integral parts (a), and the counter (Z) counts one additional digit for one cycle. For arbitrary fractional divisors, the maximum phase-jitter amplitude is equal to the smallest adjustable time delay and, hence, considerably smaller than the clock period (T') of the signal to be divided (F).

1 Claim, 2 Drawing Figures

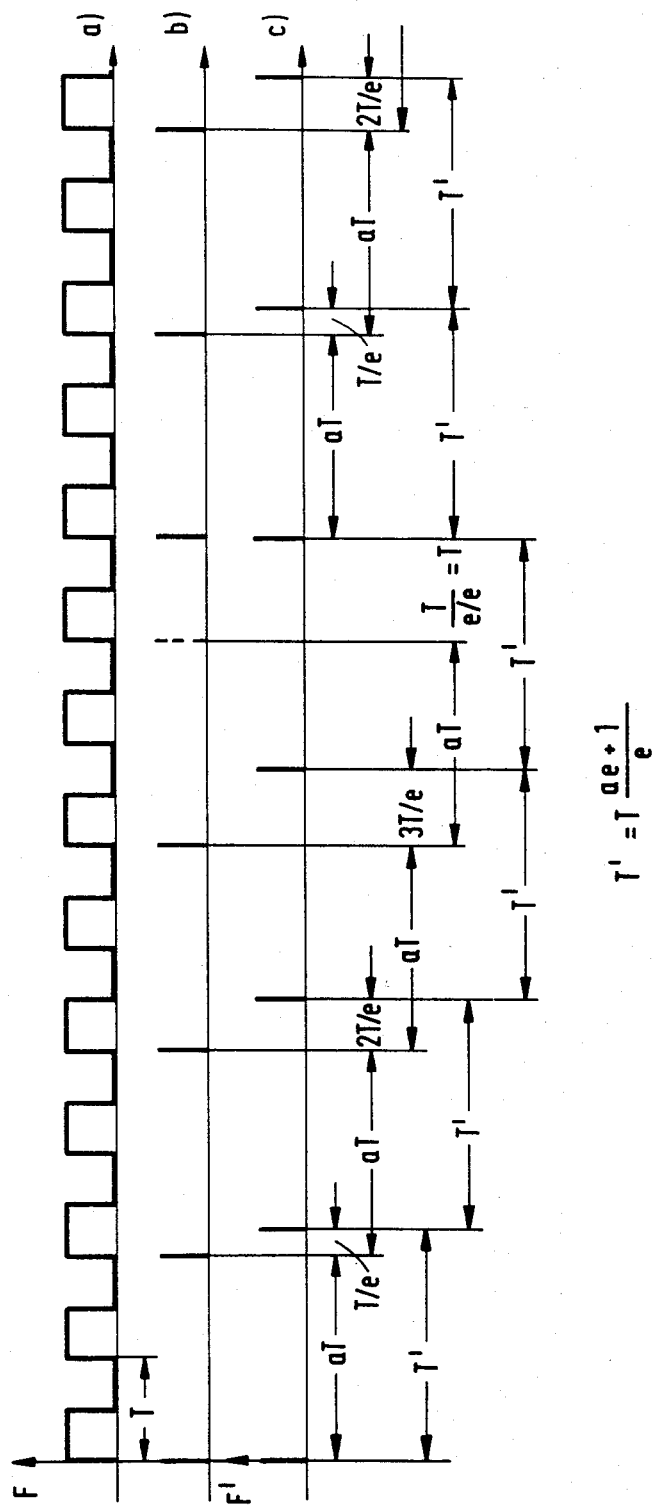

FREQUENCY DIVIDER PRESETTABLE TO FRACTIONAL DIVISORS

The present invention relates to frequency dividers presettable to fractional divisors and including a counter presettable to integers, as are disclosed, for example, in Offenlegungsschrift DE No. 27 53 453 A1. The frequency divider disclosed there divides by 2½, 3, and 3 ½ in a predetermined rhythm; to this end, the counter is presettable to counting full and half clock periods. Thus, this frequency divider also divides by "half" divisors; however, it is not suitable for dividing by arbitrary fractions, i.e., fractions with arbitrary sequences of digits to the right of the decimal point or with arbitrary denominators in case of fraction-line representation.

In the arrangement disclosed in applicant's own prior European Application No. 81 10 5412.1, an attempt is made to solve the problem of dividing frequencies by fractions within a frequency synthesis arrangement by making the generator producing the signal to be divided switchable between two frequencies one of which is about 1 to 10% higher than the other, and performing the frequency switchover with a given periodicity. However, one of the drawbacks of this prior solution is that the frequency-divided output signal exhibits phase jitter.

The invention is intended to remedy this drawback. The object of the invention as claimed is to provide a frequency divider dividing by fractions whose output signal exhibits no phase jitter.

The invention will now be explained in more detail with reference to the accompanying drawings, in which:

FIG. 1 is a block diagram showing the circuit principle underlying the invention, and FIG. 2 shows the time relationship between the signal to be frequency divided and the frequency-divided signal.

The block diagram of FIG. 1 shows the counter Z, which is presettable to integers via its set inputs Es, and whose count input Ez must be provided with the signal to be frequency-divided, F. Its maximum-count output Am is coupled to the input of the digitally adjustable delay line V, whose output delivers the frequency-divided signal F'. The setting-step width of the delay line V must be chosen to be equal to the period T of the divider input signal F divided by the denominator e of the divisor c/e. For the purposes of the invention, recourse is made to the various, mathematically possible representations of a fraction, which can be represented in general form as follows:

$$a + 0.b = (c/e) = a + (d/e)$$

In this relation, the left-hand term corresponds to the well-known decimal point representation (e.g., 1.2), the middle term is the representation as an improper fraction (e.g., 6/5), and the right-hand term is the mixed representation consisting of an integer and a proper fraction (1 1/5).

The setting-step width of the delay line V must thus be equal to the eth part of the period T. An arrangement which can be used to advantage for the digitally adjustable delay line V is the one disclosed in applicant's own prior European Application No. 81 20 0255.8. This arrangement consists essentially of IGFET integrated inverter pairs which are connected in series with respect to the signal flow, and whose inherent pair delay is taken from different outputs of the series connection and summed up. By periodically connecting an odd number of inverters in series to form a ring, it is possible in that arrangement to determine the pair delay from the self-excited oscillation and to readjust this delay by means of a control voltage derived from this measurement and acting on the load transistors of the inverters.

The divisor is entered into the divisor register R through the input E in decimal point representation, i.e., in the form a+0.b as defined above. The divisor register R consists of the stages Rb, holding the fractional parts b of the divisor, and the stages Ra, holding the integral part a. The outputs of the stages are designated Ab and Aa, respectively. The output Ab of the stages Rb, holding the fractional parts of the divisor, is coupled to the first input E1 of the first adder A1, whose output A is connected to the input E of the buffer memory S. The output A of the buffer memory S is coupled to the set inputs Es of the delay line V and to the second input E2 of the first adder A1. The buffer memory S and the first adder A1 thus form a so-called accummulator for the numbers applied to the first input E1.

The overflow output Ao of the first adder A1 is connected to the least significant digit LB of the first input E1 of the second adder A2, whose second input E2 is connected to the output Aa of the stages Ra of the divisor register R, which hold the integral parts a of the divisor. The enable input En of the buffer memory S is connected to one of the count outputs An of the counter Z, which lie before the maximum count Am, and is thus clocked once per cycle of this counter. Thus, at the enable instant in each count cycle, the word appearing at the output A of the first adder A1 is transferred into the buffer memory S and simultaneously applied to the second input E2 of the first adder A1. Consequently, the word with the fractional parts b which is applied to the input E1 is added, and the result at the output A of the buffer memory S and, hence, at the set input Es of the delay line V is incremented by the number with the fractional parts in each cycle of the counter Z. In each of these cycles, the delay of the delay line V thus increases by the amount corresponding to the number with the fractional parts b. When the first adder A1 reaches its maximum capacity, its overflow output Ao provides an overflow signal which is applied to the least significant digit LB of the first input E1 of the second adder A2 and increases the result of this adder by one unit. Since the output A of this second adder A2 is connected to the set input Es of the counter Z, the word set by the integral parts a of the divisor is increased by one unit, and the counter Z passes through a cycle which is one period T longer than its other cycles. When the above-mentioned overflow signal appears at the overflow output Ao of the first adder A1, the latter returns to the state in which only the fractional parts b of the divisor are summed up, so that the overflow signal disappears, the counter Z again passes through its shorter cycles, and the delay line V begins with the setting given by the fractional parts b and with any remainder of the preceding addition.

To permit a better understanding of the operation just described, FIG. 2 shows a pulse diagram for a numerical example with the number 2.25=2+¼. FIG. 2a shows the shape of the input signal F to be frequency-divided, which has the period T, and FIG. 2b shows the input signal of the delay line V in the form of needle pulses. Starting with the pulse coinciding in FIG. 2b with the y-axis, the counter Z divides by 2 and the delay line V is set to T/4, so that after a time 2T+T/4, the pulse of the frequency-divided signal F' of FIG. 2c is provided. In the next count cycle, ¼ is added to ¼ in the first adder A1, thereby increasing the delay of the delay line V to T2/4=T/2, so that the next pulse of the frequency-divided signal F' appearing at the output of the delay line lags the second pulse in FIG. 2b by 2T+T/2. In the next count cycle, the set signal for the delay line increases to ¾, so that the third pulse of the frequency-divided output signal F' lags the third pulse in FIG. 2b by 2T+3T/4. In the next, fourth count cycle, the overflow output Ao of the first adder A1 provides an overflow signal which sets the counter to a divisor increased by 1, i.e., to 3, so that three clock periods T elapse after the fourth pulse in FIG. 2b until a pulse appears at the maximum-count output Am of the counter. This changeover from the divisor 2 to the divisor 3 is indicated in FIG. 2b by the dashed pulse, which corresponds to the divisor 2 but does not occur. The period T' of the signal F' is always equal to (ae+1)T/e.

The stripe-like connections shown in FIG. 1 are to illustrate that parallel data connections are present between the individual subcircuits, and that parallel signal processing takes place with respect to these subcircuits. Although the frequency divider according to the invention is suitable for realization in any number system, it is particularly advantageous if the binary number system is used. In that case, the adders are binary adders, and the counter Z is a binary counter.

The frequency divider according to the invention is especially suitable for integration using insulated-gate field-effect transistors, i.e., so-called MOS technology. A preferred application is in a digital phase-locked loop for synchronizing television receivers using digital signal processing techniques.

The frequency-divided signal F' exhibits no phase jitter if the reciprocal e/d of the above proper fraction d/e is an integer; in this case, the overflow signal appears at the overflow output Ao after precisely e cycles of the counter Z. By contrast, if the reciprocal e/d is a fraction, in the eth cycle of the counter Z the digits other than zero will remain in the first adder A1 as the initial value for the addition during the next e count cycles, i.e., this "remainder" will not be lost. Thus, the output signal F' will always be free of phase jitter. The main advantage of the invention thus follows from the solution of the problem. For arbitrary fractional divisors, the maximum phase-jitter amplitude is equal to the shortest adjustable delay time and, hence, considerably smaller than the clock period T' of the signal to be divided, F.

I claim:

1. Frequency divider presettable to fractional divisors (c/e) and including a counter (Z) presettable to integers, characterized by the following features:

Those stages (Rb) of a divisor register (R) holding the fractional parts (b) of the divisor (c/e) in decimal point representation (a+0.b) are connected to the first input (E1) of a first adder (A1) having its output (A) coupled to the input of a buffer memory (S);

the output of the buffer memory (S) is coupled to the second input (E2) of the first adder (A1) and to the set input (Es) of a digitally adjustable delay line (V) whose setting-step width is equal to the period (T) of the divider input signal (F) divided by the nominator (e) of the divisor (c/e), and whose input is connected to the maximum-count output (Am) of the counter (Z), and the overflow (Ao) of the first adder (A1) is coupled to the least significant digit (LB) of the first input (E1) of a second adder (A2), whose second input (E2) is connected to those stages (Ra) of the divisor register (R) holding the integral parts (a) of the divisor (c/e), and whose output (A2) is coupled to the set input (Es) of the counter (Z), and the enable input (En) of the buffer memory (S) is connected to one of the count outputs (An) of the counter (Z), which lie before the maximum-count output (An).

* * * * *